(12) United States Patent
Kablanian et al.

(10) Patent No.: US 6,587,364 B1
(45) Date of Patent: Jul. 1, 2003

(54) SYSTEM AND METHOD FOR INCREASING PERFORMANCE IN A COMPILABLE READ-ONLY MEMORY (ROM)

(75) Inventors: Adam Aleksan Kablanian, San Jose, CA (US); Deepak Sabharwal, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 10/128,441

(22) Filed: Apr. 23, 2002

Related U.S. Application Data

(62) Division of application No. 09/750,949, filed on Dec. 28, 2000, now Pat. No. 6,424,556.

(51) Int. Cl.[7] .............................................. G11C 16/04
(52) U.S. Cl. ..................................... 365/63; 365/185.11
(58) Field of Search ............................ 365/63, 185.04, 365/185.11, 185.13

(56) References Cited

U.S. PATENT DOCUMENTS

| | | | | |
|---|---|---|---|---|
| 5,268,861 A | * | 12/1993 | Hotta | 365/104 |
| 5,852,570 A | * | 12/1998 | Hotta et al. | 365/104 |
| 5,982,669 A | * | 11/1999 | Kalnitsky et al. | 365/185.28 |

* cited by examiner

*Primary Examiner*—Michael S. Lebentritt
*Assistant Examiner*—Anh Phung
(74) *Attorney, Agent, or Firm*—Danamraj & Youst, P.C.

(57) ABSTRACT

A compilable ROM architecture with enhanced performance characteristics, i.e., increased speed and lowered power consumption, wherein a plurality of memory locations are organized into one or more I/O blocks, each having a select number of bitlines. Each memory location is addressable by a row address and a column address. The data is stored in the ROM using a scrambled addressing scheme wherein a portion of the row and column addresses is interchanged in order to minimize bitline loading of the binary 0's.

21 Claims, 14 Drawing Sheets

|  | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 |
|---|---|---|---|---|---|---|---|---|---|---|---|---|---|---|---|---|
| WL8 | 0 | 0 | 0 | 0 | 0 | 0 | 0 | 0 | 1 | 1 | 1 | 1 | 1 | 1 | 1 | 1 |
| WL7 | 1 | 0 | 1 | 0 | 1 | 0 | 0 | 0 | 1 | 1 | 1 | 0 | 1 | 1 | 1 | 0 |
| WL6 | 1 | 1 | 0 | 1 | 1 | 0 | 1 | 1 | 1 | 1 | 1 | 1 | 1 | 1 | 1 | 0 |
| WL5 | 1 | 0 | 1 | 0 | 0 | 0 | 1 | 0 | 1 | 0 | 1 | 1 | 1 | 0 | 1 | 0 |
| WL4 | 1 | 0 | 1 | 0 | 0 | 1 | 0 | 0 | 0 | 1 | 0 | 1 | 1 | 0 | 0 | 0 |
| WL3 | 0 | 0 | 0 | 0 | 0 | 0 | 0 | 0 | 1 | 0 | 1 | 1 | 0 | 1 | 0 | 0 |
| WL2 | 0 | 0 | 0 | 1 | 0 | 0 | 0 | 1 | 0 | 1 | 1 | 0 | 0 | 1 | 1 | 0 |
| WL1 | 0 | 0 | 0 | 1 | 0 | 0 | 1 | 0 | 1 | 1 | 0 | 1 | 0 | 1 | 0 | 1 |

FIG. 3A

|     | BL1 | BL2 | BL3 | BL4 | BL5 | BL6 | BL7 | BL8 | BL9 | BL10 | BL11 | BL12 | BL13 | BL14 | BL15 | BL16 |
|-----|-----|-----|-----|-----|-----|-----|-----|-----|-----|------|------|------|------|------|------|------|
| WL8 | 1   | 1   | 1   | 1   | 1   | 1   | 1   | 1   | 1   | 1    | 1    | 1    | 1    | 1    | 1    | 1    |
| WL7 | 0   | 0   | 0   | 1   | 0   | 1   | 1   | 1   | 1   | 1    | 1    | 0    | 1    | 1    | 1    | 0    |
| WL6 | 0   | 1   | 1   | 0   | 0   | 1   | 0   | 0   | 1   | 1    | 1    | 1    | 1    | 1    | 1    | 0    |
| WL5 | 0   | 0   | 0   | 1   | 1   | 0   | 1   | 1   | 0   | 0    | 0    | 1    | 1    | 0    | 1    | 0    |
| WL4 | 0   | 1   | 0   | 1   | 1   | 1   | 1   | 1   | 1   | 1    | 0    | 1    | 0    | 0    | 0    | 0    |
| WL3 | 1   | 1   | 1   | 0   | 1   | 1   | 1   | 0   | 0   | 0    | 1    | 0    | 0    | 1    | 0    | 0    |
| WL2 | 1   | 1   | 1   | 0   | 1   | 1   | 0   | 1   | 0   | 1    | 0    | 0    | 0    | 1    | 1    | 0    |
| WL1 | 1   | 1   | 1   | 0   | 1   | 1   | 0   | 1   | 1   | 1    | 0    | 1    | 0    | 1    | 0    | 1    |

FIG. 3B

| | Y1 | Y2 | Y3 | Y4 | Y5 | Y6 | Y7 | Y8 | Y1 | Y2 | Y3 | Y4 | Y5 | Y6 | Y7 | Y8 |
|---|---|---|---|---|---|---|---|---|---|---|---|---|---|---|---|---|
| | BL 1 | BL 2 | BL 3 | BL 4 | BL 5 | BL 6 | BL 7 | BL 8 | BL 9 | BL 10 | BL 11 | BL 12 | BL 13 | BL 14 | BL 15 | BL 16 |
| WL8 | 0 | 0 | 0 | 0 | 0 | 0 | 0 | 0 | 1 | 1 | 1 | 1 | 1 | 1 | 1 | 1 |
| WL7 | 1 | 0 | 1 | 0 | 1 | 0 | 0 | 0 | 1 | 1 | 1 | 0 | 1 | 1 | 1 | 0 |
| WL6 | 1 | 1 | 0 | 1 | 1 | 0 | 1 | 1 | 1 | 1 | 1 | 1 | 1 | 1 | 1 | 0 |
| WL5 | 1 | 0 | 1 | 0 | 0 | 0 | 0 | 0 | 1 | 0 | 0 | 1 | 1 | 0 | 1 | 0 |
| WL4 | 1 | 0 | 1 | 0 | 0 | 1 | 0 | 0 | 0 | 1 | 1 | 1 | 1 | 0 | 0 | 0 |
| WL3 | 0 | 0 | 0 | 0 | 0 | 0 | 0 | 0 | 0 | 1 | 1 | 0 | 0 | 1 | 0 | 0 |
| WL2 | 0 | 0 | 0 | 1 | 0 | 0 | 0 | 1 | 1 | 1 | 0 | 0 | 0 | 1 | 1 | 0 |
| WL1 | 0 | 0 | 0 | 0 | 0 | 0 | 1 | 0 | 1 | 0 | 1 | 1 | 0 | 1 | 0 | 1 |
| #0'S/#BL'S | 4/8 | 7/8 | 5/8 | 5/8 | 6/8 | 7/8 | 5/8 | 6/8 | 2/8 | 2/8 | 2/8 | 2/8 | 3/8 | 2/8 | 3/8 | 6/8 |

|  | Y1<br>BL 1 | Y2<br>BL 2 | Y3<br>BL 3 | Y4<br>BL 4 | Y5<br>BL 5 | Y6<br>BL 6 | Y7<br>BL 7 | Y8<br>BL 8 | Y1<br>BL 9 | Y2<br>BL 10 | Y3<br>BL 11 | Y4<br>BL 12 | Y5<br>BL 13 | Y6<br>BL 14 | Y7<br>BL 15 | Y8<br>BL 16 |
|---|---|---|---|---|---|---|---|---|---|---|---|---|---|---|---|---|
| WL8 | 0 | 1 | 1 | 1 | 1 | 1 | 1 | 1 | 1 | 1 | 1 | 1 | 1 | 1 | 1 | 0 |
| WL7 | 1 | 1 | 0 | 1 | 0 | 1 | 1 | 1 | 1 | 1 | 1 | 0 | 1 | 1 | 1 | 1 |
| WL6 | 1 | 0 | 1 | 0 | 0 | 1 | 0 | 0 | 1 | 1 | 1 | 1 | 1 | 1 | 1 | 1 |
| WL5 | 1 | 1 | 0 | 1 | 1 | 1 | 0 | 1 | 0 | 1 | 0 | 1 | 1 | 0 | 1 | 1 |
| WL4 | 1 | 1 | 0 | 1 | 1 | 0 | 1 | 1 | 1 | 1 | 1 | 1 | 1 | 0 | 0 | 1 |
| WL3 | 0 | 1 | 1 | 0 | 1 | 1 | 1 | 1 | 0 | 1 | 1 | 1 | 0 | 1 | 0 | 1 |
| WL2 | 0 | 1 | 1 | 0 | 1 | 1 | 1 | 1 | 1 | 1 | 0 | 0 | 0 | 1 | 1 | 1 |
| WL1 | 0 | 1 | 1 | 0 | 1 | 1 | 0 | 1 | 1 | 1 | 0 | 1 | 0 | 1 | 0 | 0 |
| #0'S/#BL'S | 4/8 | 1/8 | 3/8 | 3/8 | 2/8 | 1/8 | 3/8 | 2/8 | 2/8 | 2/8 | 2/8 | 2/8 | 3/8 | 2/8 | 3/8 | 2/8 |

| X2X1Y0 | | BL1 | BL2 | BL3 | BL4 | BL5 | BL6 | BL7 | BL8 |
|---|---|---|---|---|---|---|---|---|---|
| 111 | WL8 | W7_B2 | W8_B2 | W7_B4 | W8_B4 | W7_B6 | W8_B6 | W7_B8 | W8_B8 |
| 110 | WL7 | W7_B1 | W8_B1 | W7_B3 | W8_B3 | W7_B5 | W8_B5 | W7_B7 | W8_B7 |
| 101 | WL6 | W5_B2 | W6_B2 | W5_B4 | W6_B4 | W5_B6 | W6_B6 | W5_B8 | W6_B8 |
| 100 | WL5 | W5_B1 | W6_B1 | W5_B3 | W6_B3 | W5_B5 | W6_B5 | W5_B7 | W6_B7 |
| 011 | WL4 | W3_B2 | W4_B2 | W3_B4 | W4_B4 | W3_B6 | W4_B6 | W3_B8 | W4_B8 |
| 010 | WL3 | W3_B1 | W4_B1 | W3_B3 | W4_B3 | W3_B5 | W4_B5 | W3_B7 | W4_B7 |
| 001 | WL2 | W1_B2 | W2_B2 | W1_B4 | W2_B4 | W1_B6 | W2_B6 | W1_B8 | W2_B8 |
| 000 | WL1 | W1_B1 | W2_B1 | W1_B3 | W2_B3 | W1_B5 | W2_B5 | W1_B7 | W2_B7 |
| | Y2Y1X0 | 000 | 001 | 010 | 011 | 100 | 101 | 110 | 111 |

FIG. 10B

SYSTEM AND METHOD FOR INCREASING PERFORMANCE IN A COMPILABLE READ-ONLY MEMORY (ROM)

CROSS-REFERENCE TO RELATED APPLICATION

This application is a divisional of the following co-pending patent application: "System and Method for Increasing Performance in a Compilable Read-Only Memory (ROM)," filed Dec. 28, 2000, Ser. No. 09/750,949, now U.S. Pat. No. 6,424,556 issued on Jul. 23, 2002, in the names of Adam Aleksan Kablanian and Deepak Sabharwal, which is hereby incorporated by reference for all purposes.

BACKGROUND OF THE INVENTION

1. Technical Field of the Invention

The present invention relates generally to semiconductor memories, and more particularly, to techniques for enhancing performance characteristics of a compilable read-only memory (ROM) instance.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, nonvolatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design reuse is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory, including ROM, is a key technology driver for SOC design. It is also well known that speed and power consumption are two major factors in designing a high performance ROM core. In typical ROM architectures, a transistor is placed at the intersection of every bitline (BL) and wordline (WL) with the transistor' gate being connected to the WL. Depending on the actual ROM code to be programmed, the transistor of the bit cell is either connected to the BL (for storing a binary 0) or left open (for storing a binary 1).

It should be appreciated that as the number of binary 0's on a BL increases, its capacitance also increases because of the parasitic diffusion capacitance of the transistor's drain connected thereto. It is possible that in some instances the ROM code to be programmed may have a large number of 0's on one or more BLs, resulting in degraded performance with respect to both speed and power. First, as more 0's are programmed on a BL, that particular BL will discharge more often during access cycles because of its pre-charge condition. This, in turn, implies that the BL will consume more power for bringing it back to a pre-charge condition relative to a BL that has more 1's. Further, the same power consumption constraints also apply to the entire ROM core on a per input/output (I/O) block basis even where individual BL loading of binary 0's is relatively comparable across the BLs of a particular I/O block.

In addition, having more 0's on a BL results in larger parasitic capacitance which leads to a slower rate of discharge. Consequently, access time characteristics of the ROM are severely degraded. Clearly, this leads to undesirable operating conditions for high performance embedded applications.

Based on the foregoing, it should be readily recognized that there has arisen an acute need for an effective yet efficient solution that increases performance characteristics of ROMs without incurring unacceptable penalties in silicon area, design complexity, or process flow required for its implementation. It would be of further advantage that the solution be adaptable for compilable ROM architectures so that increased performance may be realized in embedded applications as well.

SUMMARY OF THE INVENTION

Accordingly, the present invention is directed to providing techniques for increasing performance by reducing bit-line capacitance (hence increasing speed and lowering power consumption) in a compilable ROM core by manipulating the distribution of the binary contents therein.

In one aspect, the present invention is directed to a technique wherein row and column addresses are scrambled for achieving a desired distribution of the data map to be programmed into the ROM. Upon providing a predetermined data map, the number and distribution of binary 0's and 1's in the ROM are analyzed under normal row and column addressing. Thereafter, a select portion of the row addresses is interchanged with a select portion of the column addresses and the distribution of 0's and 1's is analyzed again under the scrambled addressing scheme. This process of scrambling addresses and comparing the resultant distributions of the binary data may take place until various possible combinations of row and column address interchanging have been verified. Subsequently, a particular addressing scheme is selected for programming the ROM with the pattern having the best possible distribution of 0's and 1's that optimizes speed and power.

In another aspect, the present invention is directed to a compilable ROM having a data map programmed with a scrambled addressing scheme wherein at least a portion of the row and column addresses is interchanged therebetween. The interchanged addressing scheme is determined upon analyzing the distribution of 0's and 1's of the ROM code under various combinations of scrambling between the row and columns addresses. By minimizing the bitline loading of 0's in the ROM core, speed is gained and power consumption is reduced.

BRIEF DESCRIPTION OF THE DRAWINGS

A more complete understanding of the present invention may be had by reference to the following Detailed Description when taken in conjunction with the accompanying drawings wherein:

FIGS. 3A and 3B depict an exemplary data map for a ROM with two I/O blocks for illustrating the technique of data inversion per I/O;

FIGS. 6A and 6B depict an exemplary data map for a ROM with two I/O blocks for illustrating the technique of data inversion per bitline;

FIGS. 10A and 10B depict a single I/O ROM example for illustrating the technique of address scrambling in order to achieve a predetermined binary data distribution condition that optimizes speed and power consumption of the ROM.

DETAILED DESCRIPTION OF THE DRAWINGS

Figure 1:
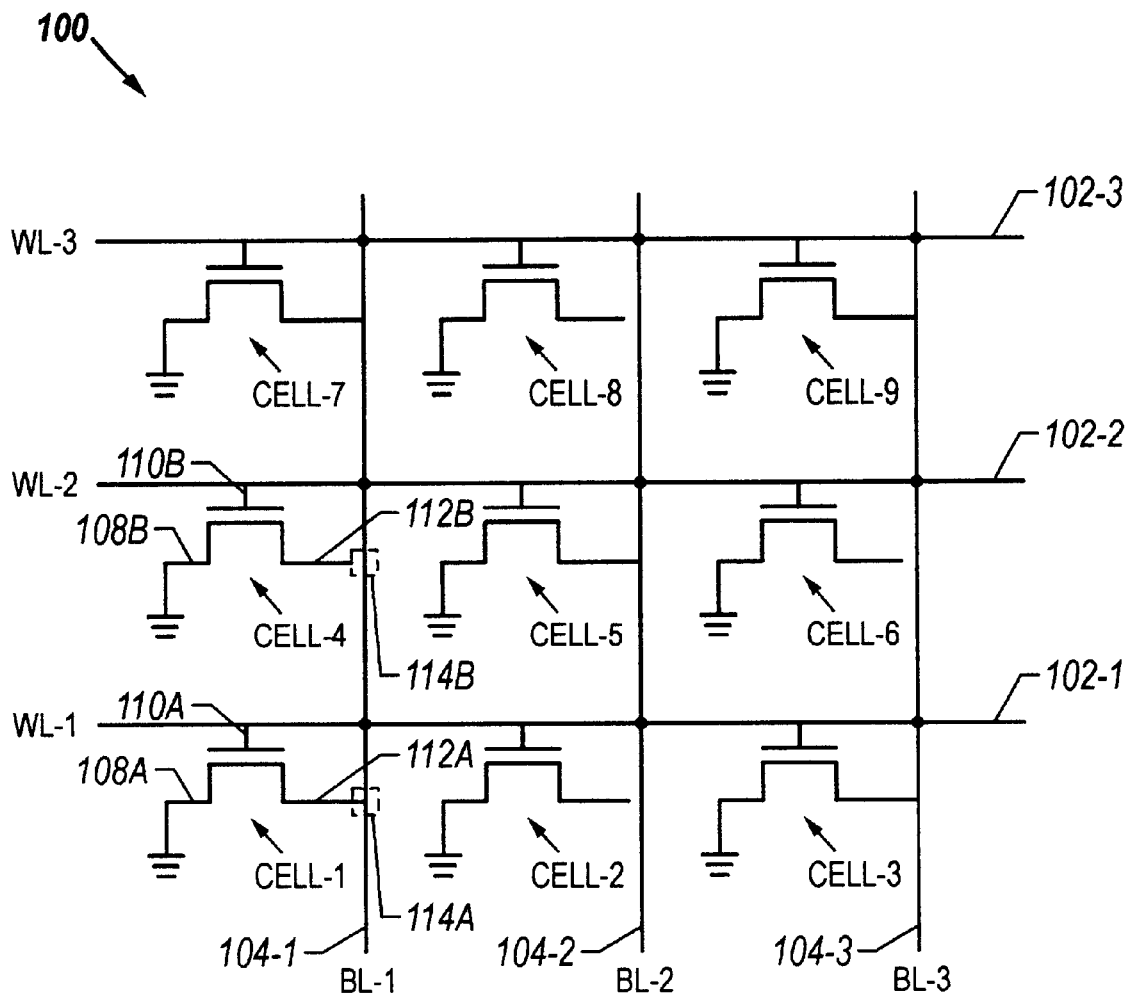
FIG. 1 depicts an architectural view of a presently preferred exemplary embodiment of a read-only memory (ROM) portion wherein the teachings of the present invention may be advantageously practiced.

In the drawings, like or similar elements are designated with identical reference numerals throughout the several views thereof, and the various elements depicted are not necessarily drawn to scale. Referring now to FIG. 1, depicted therein is an architectural view of a presently preferred exemplary embodiment of a read-only memory (ROM) portion 100 wherein the teachings of the present invention may be advantageously practiced. Preferably, the ROM portion 100 is comprised of mask-programmable embedded ROM circuitry that is compiler-friendly such that ROM cores of different sizes may be provided for use within multiple SOC designs.

As is well known, in the case of ROM, the data contents are already programmed at mask level into the memory array and are unalterable. Preferably, only a small number of mask levels such as, e.g., a single metal layer, contact layer, diffusion layer, or a via mask layer (where multi-level metal layers separated by nonconductive films are used), are involved in the programming step. Three wordlines (WLs) are exemplified in the ROM core portion 100: WL-1 (reference numeral 102-1), WL-2 (reference numeral 102-2), and WL-3 (reference numeral 102-3). Three bitlines (BLs) (which intersect the WLs and thereby form an array) are similarly illustrated in the exemplary ROM core portion 100: BL-1 (reference numeral 104-1), BL-2 (reference numeral 104-2), and BL-3 (reference numeral 104-3). A memory cell (or bit cell), typically comprising a MOS transistor, is formed at the intersection of each WL and BL. Accordingly, nine memory cells, CELL-1 through CELL-9, are illustrated in FIG. 1.

Continuing to refer to FIG. 1, the general operation of the ROM memory cells is described in particular reference to CELL-1 and CELL-4. With respect to CELL-1, gate 110A thereof is connected to WL-1 102-1, source 108A is grounded, and drain 112A is connected to BL-1 104-1 as exemplified by connection segment 114A. Accordingly, a binary 0 is stored at the memory location identified by CELL-1. In similar fashion, gate 110B of the transistor forming CELL-4 is connected to WL-2 102-2, source 108B is grounded, and drain 112B is left open without connecting to BL-1 104-1 as exemplified by open connection segment 114B. Consequently, a binary 1 is stored at the memory location identified by CELL-4. As is well known in the memory design art, it is the placement of connection segments (or lack thereof) between drains and BLs effectuated during the fabrication process that programs a particular data map or code into the ROM core.

Before a memory read cycle is effectuated, the BLs are typically pre-charged to a high state (VDD). When WL-1 is turned on (based on a suitable address decoding process which generates appropriate signals in a row decoder, not shown in FIG. 1), BL-2 remains high (because its drain is left open) while BL-1 and BL-3 are pulled low by the MOS transistors at CELL-1 and CELL-3 (because their drains are coupled to BL-1 and BL-3, respectively). Therefore, for the row address corresponding to WL-1 102-1, the data output will be 010. Similarly, when WL-2 102-2 or WL-3 102-3 is turned on, the data output will be 101 or 010, respectively. It should be recognized by those skilled in the art that although column multiplexer (MUX) circuitry and sense amplifier/column drive (SA/CD) circuitry typically employed as part of a memory instance (wherein the plurality of memory locations may be organized into one or more input/output or I/O blocks) are not shown in FIG. 1 for the sake of simplicity, such circuitry is utilized in data output operations with respect to the ROM core portion 100.

Based on the foregoing, it should be appreciated that a transistor placed at the intersection of every BL and WL of the ROM core is either connected to the BL (for binary 0) or left open (for binary 1), depending upon the code or data map to be programmed in the ROM. When a BL is connected to the transistor, BL's capacitance increases because it is loaded by the diffusion capacitance of the transistor's drain. Thus, as the number of binary 0's on a BL increases, its parasitic capacitance also increases proportionately. As pointed out in the Background section of the present patent application, having a large number of binary 0's on a BL gives rise to several deleterious effects with respect to the performance of the ROM.

Figure 2:
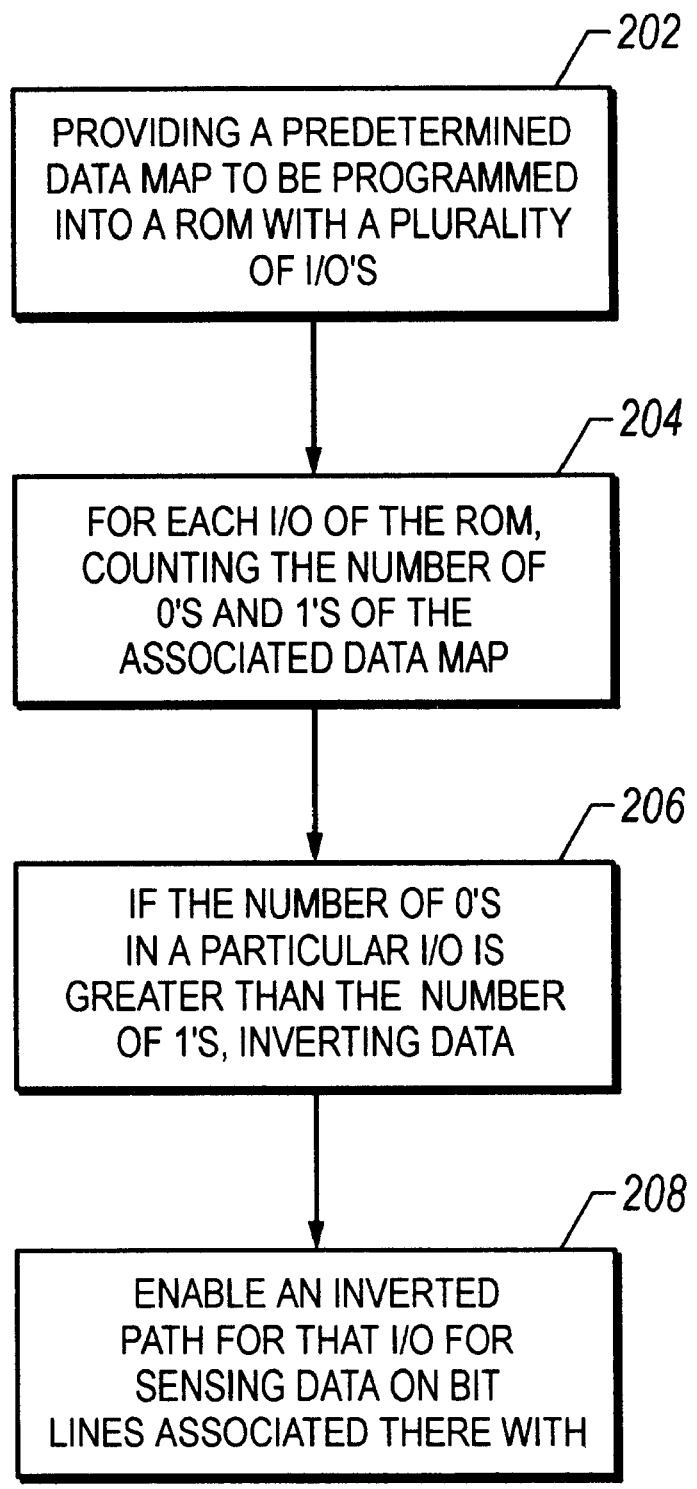
FIG. 2 is a flow chart of the steps involved in an exemplary technique for increasing performance in a ROM in accordance with teachings of the present invention, wherein the contents of an I/O block are inverted in order to minimize the loading of 0's therein.

Referring now to FIG. 2, depicted therein is a flow chart of the steps involved in an exemplary technique for increasing performance in a ROM in accordance with teachings of the present invention, wherein the contents of an I/O block of the ROM instance are inverted to minimize the number of binary 0's therein. Upon providing a predetermined data map (i.e., ROM code) to be programmed in the ROM instance having one or more I/O blocks (step 202), the distribution of binary 0's and 1's is analyzed for each I/O by counting the number of 0's and 1's therein (step 204). As discussed hereinabove, the bitlines make a transition from high to low when binary 0's are accessed, and such transitions cause higher power consumption because of the subsequent pre-charge cycles. Accordingly, if the number of binary 0's in the core associated with a particular I/O is greater than the number of binary 1's therein, the data to be stored in the core portion is inverted (e.g., by complementing each bit in the core portion associated with the I/O) at the time of programming so as to minimize the number of transitions that the BLs in that I/O undergo for data output operations (step 206). Further, an "inverter path" portion is enabled in the output path circuitry associated with the I/O at the time of programming the ROM where the data in the I/O block has been inverted, for accurately outputting the original data portion (step 208).

FIGS. 3A and 3B depict exemplary data maps (reference numerals 300A and 300B, respectively) of a ROM with two I/O blocks Q1 and Q2 for illustrating the technique of data inversion per I/O for reducing power consumption in accordance with the teachings of the present invention. The ROM's physical array is comprised of eight rows (reference numerals 310-1 through 310-8) and 16 columns that are organized into Q1 and Q2 I/Os, each having eight BLs. The data map portions 302A and 304A for the two I/Os shown in FIG. 3A are comprised of data in non-inverted form. Reference numerals 306A-1 through 306A-8 and reference numerals 308A-1 through 308A-8 refer to the eight BLs in Q1 and Q2 I/O blocks, respectively. The distribution of binary 1's and 0's for Q1 is comprised of 45 0's and 19 1's, whereas Q2's distribution is comprised of 22 0's and 42 1's. Since the BLs fall when a binary 0 is accessed, the BL transitions for Q1 will be 45/64=70%. Similarly, the BL transitions for Q2 will be 22/64=34%. Accordingly, while reading the ROM array sequentially from address 0 to address MAX, the BLs will fall 70% of the time for Q1 and 34% of the time for Q2, if the ROM cells were programmed with the original data map provided.

As set forth hereinabove with respect to the flow chart depicted in FIG. 2, the data is inverted for I/O blocks having more than 50% of binary 0's (in the original data map portions). The data map 300B depicted in FIG. 3B includes the data map portion 302B for the Q1 I/O wherein the data is in inverted form. Thus, the ROM array is programmed with complementary data in Q1 while the data portion in Q2 is left untouched. As a result, Q1's distribution of the binary data will now be 19 0's and 45 1's and, consequently, the BLs for Q1 will fall only 30% of the time while reading sequentially from address 0 to address MAX.

To accurately output the data for Q1 (i.e., in the original form), an inverter path portion is enabled in the output path circuitry associated with Q1. In a presently preferred exemplary embodiment of the present invention, the inverter path portion is selectively enabled in the same process step effectuated for programming the ROM (e.g., via mask layer), thereby not impacting its fabrication sequence. FIG.

4A depicts exemplary output path circuitry 400A that includes a selectively activatable inverted path that facilitates accurate reading of Q1's inverted data. For the sake of simplicity, column MUX circuitry is not shown in the exemplary output path circuitry 400A. As the data is sensed by sense amp (SA) 404 via a muxed path 402 associated with Q1, a built-in inverter 406 of SA 404 inverts the logic state of the sensed bit. Inverter 408 inverts the logic state of the bit again which is then provided by means of either path 412A or path 412B to an output driver block 418 for outputting the data on output 424. Since path 412A and path 412B are preferably implemented on a metal layer level (e.g., M2) that is different from the metal layer level (e.g., M3) used for coupling the output block 418 by means of path 414, whether path 412A or path 412B is selected is dependent on the placement of a via between the two metal layers.

Figure 4A:
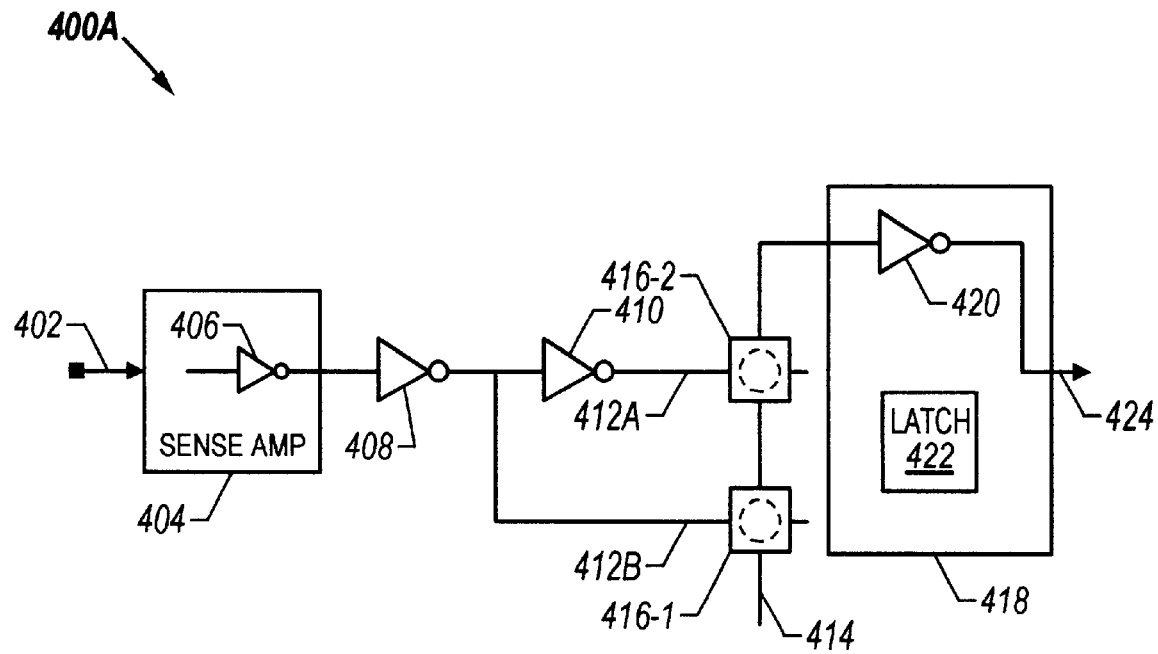
FIG. 4A depicts exemplary output path circuitry that includes a selectively activatable inverted path portion for facilitating accurate reading of the original data in a ROM having an I/O with inverted data.
Figure 4B:
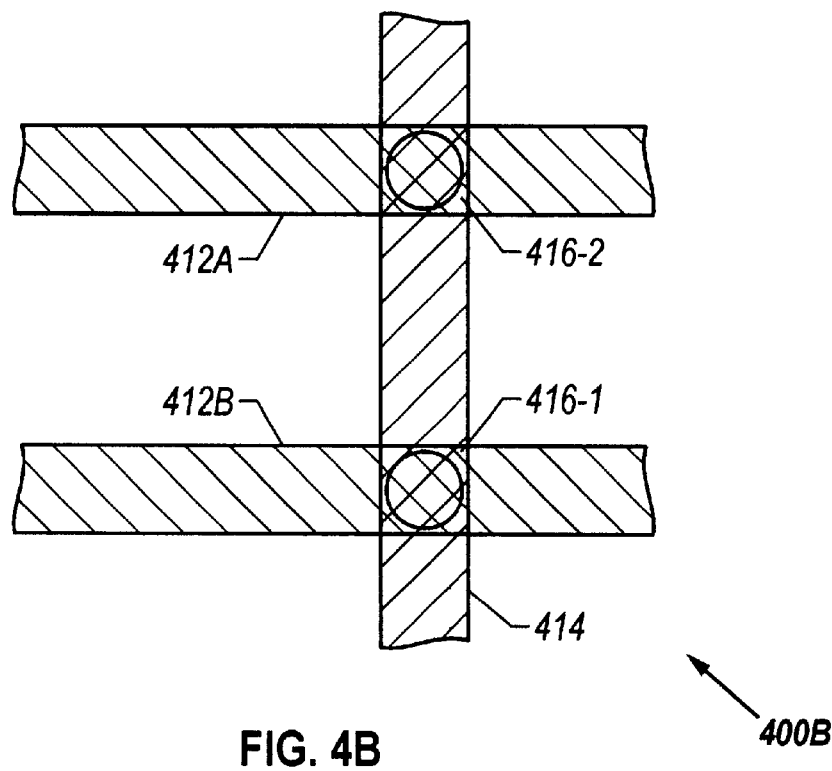
FIG. 4B depicts an exemplary layout of two metal mask layers for providing vias therebetween that are selectively fabricated during a mask-level programming step of the ROM fabrication process.

FIG. 4B depicts an exemplary layout of the two metal mask layers (N and N+1 levels) for providing vias 416-1 and 416-2 therebetween that are selectively fabricated during the mask-level programming step of the ROM. If via 416-1 is fabricated, path 412B is coupled to path 414. On the other hand, path 412A is coupled to path 414 if via 416-2 is fabricated.

Continuing to refer to FIG. 4A, path 412A includes an inverter 410 operable to invert the logic state of the data signal at the output of inverter 408. On the other hand, path 412B is operable to provide the sensed data signal directly to the output block 418 which contains an inverter 420 and appropriate latch circuitry 422. Accordingly, it should be appreciated by those skilled in the art that where via 416-2 is fabricated, path 412A is activated and the data output block is operable as a buffer (for I/O blocks with non-inverted data). On the other hand, the placement of via 416-1 enables path 412B (i.e., inverter path portion) results in inverter behavior of the output block necessary for accurately outputting the original data in selected I/Os of the ROM.

For example, with respect to the inverted data map portion 302B of Q1 (shown in FIG. 3B), the output of inverter 406 is driven low when the binary 1 stored at BL1 and WL8 is read. Consequently, the output of inverter 408 is driven high. Because the inverter path 412B is enabled (by placing via 416-1), inverter 410 is bypassed and the output of inverter 420 will be driven low, signifying a binary 0 value that corresponds to the original data. On the other hand, when data in Q2 is accessed, path 412A is enabled whereby inverter 410 is operable to drive the logic states of the data appropriately. For example, when the binary 0 stored at BL9 and WL4 is accessed, the output of inverter 406 of SA 404 is driven high. As a result, the output of inverter 408 is driven low. Since the via is now placed at location 416-2, path 412A is selected and inverter 410 is operable to drive the output of inverter 408 to logic high. The data output block 420 is operable as a buffer and inverter 420 therein drives the output path 424 to logic low, signifying the binary 0 of the original data.

It should be appreciated by those skilled in the art upon reference to the foregoing discussion that the power savings realized in the technique set forth hereinabove are based on sequential access (from address 0 to address MAX) of the entire data in the ROM. However, it may not help in increasing the ROM's access time (i.e., speed) as there may be one or more BLs which have a high number of binary 0's thereon even after appropriate data inversion per I/O. As alluded to hereinbefore, individual BL loading of binary 0's is a significant factor in negatively impacting ROM's access time because of the diffusion capacitance.

Figure 5:
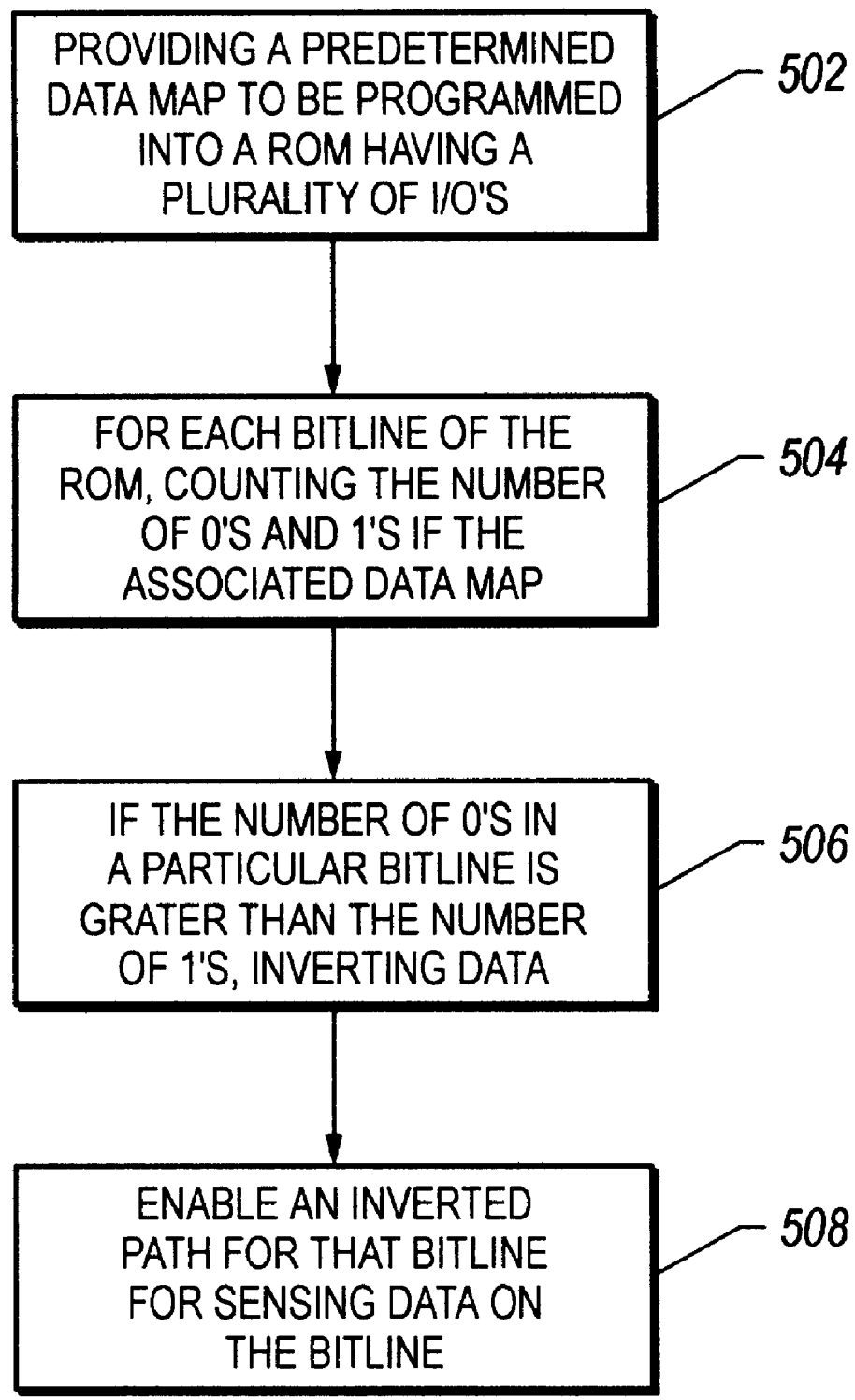
FIG. 5 is a flow chart of the steps involved in another exemplary technique for increasing performance in a ROM in accordance with teachings of the present invention, wherein the contents of a select bitline in an I/O block are inverted in order to minimize its capacitive loading.

Referring now to FIG. 5, depicted therein is a flow chart of the steps involved in another exemplary technique for increasing performance, including speed, in a compilable ROM in accordance with the teachings of the present invention, wherein the contents of a select bitline in an I/O block are inverted. Those skilled in the art should readily recognize that the methodology employed in this technique is essentially similar to the methodology described hereinabove where the contents of an entire I/O are inverted. Accordingly, only salient features of the present technique are set forth in greater detail hereinbelow.

Upon providing a predetermined data map to be programmed into the ROM (step 502) (wherein the ROM is preferably compilable and the memory cells thereof are organized into a plurality of I/Os, each having a select number of BLs), the distribution of binary data on each BL is determined by counting the 0's and 1's thereon (step 504). Once again, if the number of 0's on a particular BL is greater than 1's, the data on that BL is inverted (step 506). An inverted path portion is selectively enabled by means of appropriate logic circuitry for accurately outputting the original data on the BL with inverted values (step 508). Further, it is preferably provided that the inverted path selection logic is enabled using the same mask layer that is used for programming the ROM.

FIGS. 6A and 6B depict exemplary data maps (reference numerals 600A and 600B, respectively) of a ROM with two I/O blocks Q1 and Q2 for illustrating the technique of data inversion per BL for increasing ROM's performance in accordance with the teachings of the present invention. Similar to the example depicted in FIGS. 3A and 3B, the exemplary ROM is provided as a matrix of eight rows (referenced numerals 310-1 through 310-8) and 16 columns that are organized into Q1 and Q2 I/Os, each having eight BLs. The data map portions 602A and 604A for the two I/Os shown in FIG. 6A are comprised of data in non-inverted form. Reference numerals 606A-1 through 606A-8 and reference numerals 608A-1 through 608A-8 refer to eight column signals (Y1–Y8) associated with the eight BLs in Q1 and Q2 I/O blocks, respectively. Reference numeral 610 refers to a tabulated row of the distribution ratios of binary 0's for each BL (BL1 through BL16).

It can be seen that in the exemplary data map 600A provided for Q1 and Q2 I/Os, BL2 through BL8 and BL16 have more 0's than 1's and thus possess higher diffusion capacitance. Accordingly, the data on these lines is inverted to guarantee that the binary 0's will be no more than 50%.

FIG. 6B depicts the data map portions 602B and 604B for Q1 and Q2, respectively, wherein the data on BL2 through BL8 and BL16 is in inverted form. Thus, the ROM array is programmed with complementary data for these select BLs while the data for the remaining BLs is left untouched. As a result, it is guaranteed now that no BL in either Q1 or Q2 will have more than 50% binary 0's.

Figure 7A:
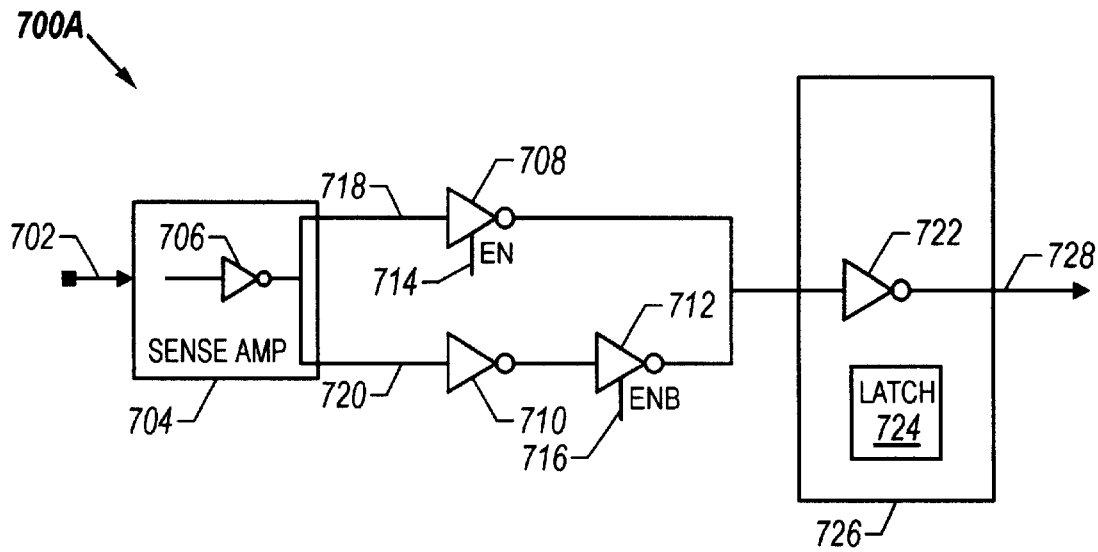
FIG. 7A depicts exemplary output path circuitry that includes a selectively activatable inverted path portion for facilitating accurate reading of the original data in a ROM having bitlines with inverted data.

FIG. 7A depicts exemplary output path circuitry 700A that includes a selectively activatable inverted path portion for facilitating accurate outputting of the original data in a ROM having BLs with inverted data. It should be apparent that selectively activating the inverter path portion is preferably based on inverter behavior or buffer behavior of the output path circuitry, which may be provided to dependent on column decoding selection logic. Once again for the sake of simplicity, appropriate column MUX circuitry is not shown in this FIG. A sense amp 704 having a built-in inverter 706 is conventionally provided for sensing the data available on a muxed path 702 driven by an appropriate BL. Either path 718 or path 720 is activated based on a pair of control signals (EN 714 and ENB 716) which are used to enable or disable inverters 708 and 712 disposed thereon respectively. That is, when EN 714 is asserted, ENB 716 is de-asserted and, accordingly, path 718 is selected while path 720 is not. In similar fashion, when ENB 716 is asserted and EN 714 is de-asserted, path 720 is selected and path 720 is de-selected. Logic circuitry for generating these control signals will be described in greater detail hereinbelow with respect to FIGS. 7B and 7C.

Continuing to refer to FIG. 7A, another inverter, inverter 710, coupled to SA 704 is disposed on path 720. The outputs of inverters 708 and 712 are coupled together and provided to a data output block 726 having an inverter 722 and appropriate latch circuitry 724 for appropriately driving an output path 728.

Figure 7B:
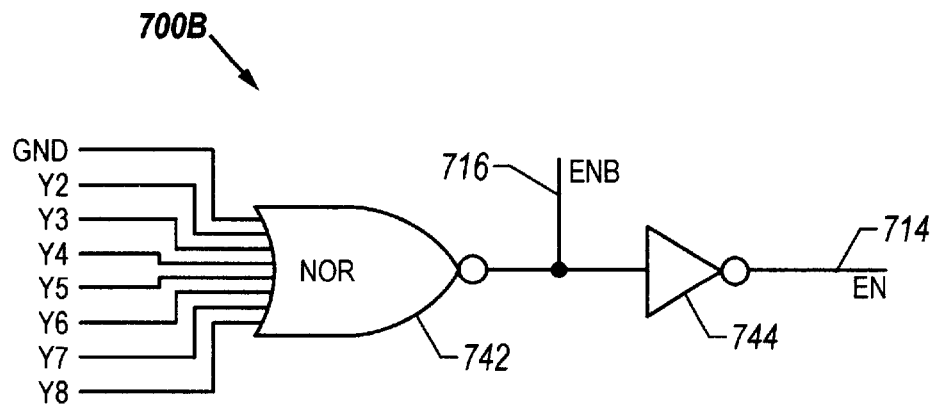
FIGS. 7B and 7C depict exemplary logic circuitry for generating control signals for selectively enabling an inverted output path portion for the ROM having bitlines with inverted data.
Figure 7C:
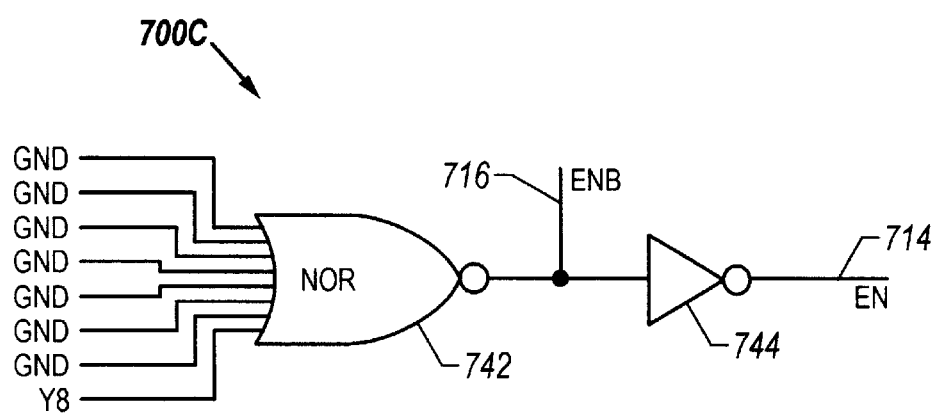

FIGS. 7B and 7C depict exemplary logic circuitry for generating EN and ENB control signals for selectively enabling/disabling paths 718 and 720 based on column decoding. It should be appreciated by those skilled in the art that the logic circuitry is preferably programmed during the mask-level programming of the ROM, similar to the output path programming described in reference to FIGS. 4A and 4C hereinabove, based on decoded column signals corresponding to the inverted bitlines. Reference numeral 700B refers to a control logic circuit used in conjunction with Q1 wherein BL2 through BL8 have inverted data. Decoded column signals Y2 through Y8 corresponding to BL2 to BL8 of Q1 are provided as input along with ground to a NOR gate 742 having a plurality of mask-programmable inputs. When data on any BL other than BL1 (which has data in non-inverted form) is accessed, one of the Y2–Y8 signals will be driven high and, accordingly, the output of NOR 742 will be driven low. As a result, ENB 716 will be logic low (i.e., de-asserted). On the other hand, because of inverter 744 coupled to the output of NOR 742, EN 714 will be logic high (i.e., asserted). Consequently, path 718 and path 720 in FIG. 7A will be selected and de-selected, respectively.

For example, when the data bit (binary 1) at the location specified by WL8 and BL2 is accessed, Y2 is high and, accordingly, the output of NOR 742 is driven low. Thus, EN 714 will be asserted which selects path 718 shown in FIG. 7A. The output of SA 704 is driven low upon sensing the data bit, which is provided to inverter 708 that is enabled by EN 714. The output of inverter 708 is provided to inverter 722 of the output block which inverts it to logic low, signifying the original data of binary 0.

When data on BL1 is accessed, e.g., binary 0 at WL3 and BL1, Y2 through Y8 will be driven low and, consequently, the output of NOR 742 will be driven high. Thus, ENB 716 will be asserted which selects path 720 of the output circuitry 700A shown in FIG. 7A. The SA's output is driven high pursuant to sensing the data bit, which is inverted by inverter 710 and re-inverted by inverter 712 that is enabled by ENB 716. Thereafter, inverter 722 of the output block 726 drives the output path 728 low in response thereto, signifying the original data of binary 0.

Reference numeral 700C depicted in FIG. 7C refers to a mask-programmable control logic circuit used in conjunction with Q2 wherein only BL16 has inverted data. Accordingly, only Y8, the decoded column signal corresponding to BL16, is gated with ground signals via NOR 742 whose inputs are provided to be mask-programmable as described hereinabove. As a result, when data on BL16 is accessed, path 718 in the output path circuitry 700A is selected for facilitating the original data on the output path 728. When data on BL9 through BL15 is accessed, ENB 716 will be driven high which selects path 720 for facilitating the data buffer behavior, similar to the operation described hereinabove with respect to Q1.

It should be realized by those skilled in the art upon reference hereto that the exemplary control logic circuitry described hereinabove for generating EN an ENB signals is one of many possible implementations thereof. Such control logic may also be implemented depending on column select lines, timing, and other control signals typically provided for the operation of a ROM. Also, it should be apparent that other logic gates (e.g., NANDs, etc.) may be utilized in realizing appropriate functionality.

Figure 8:
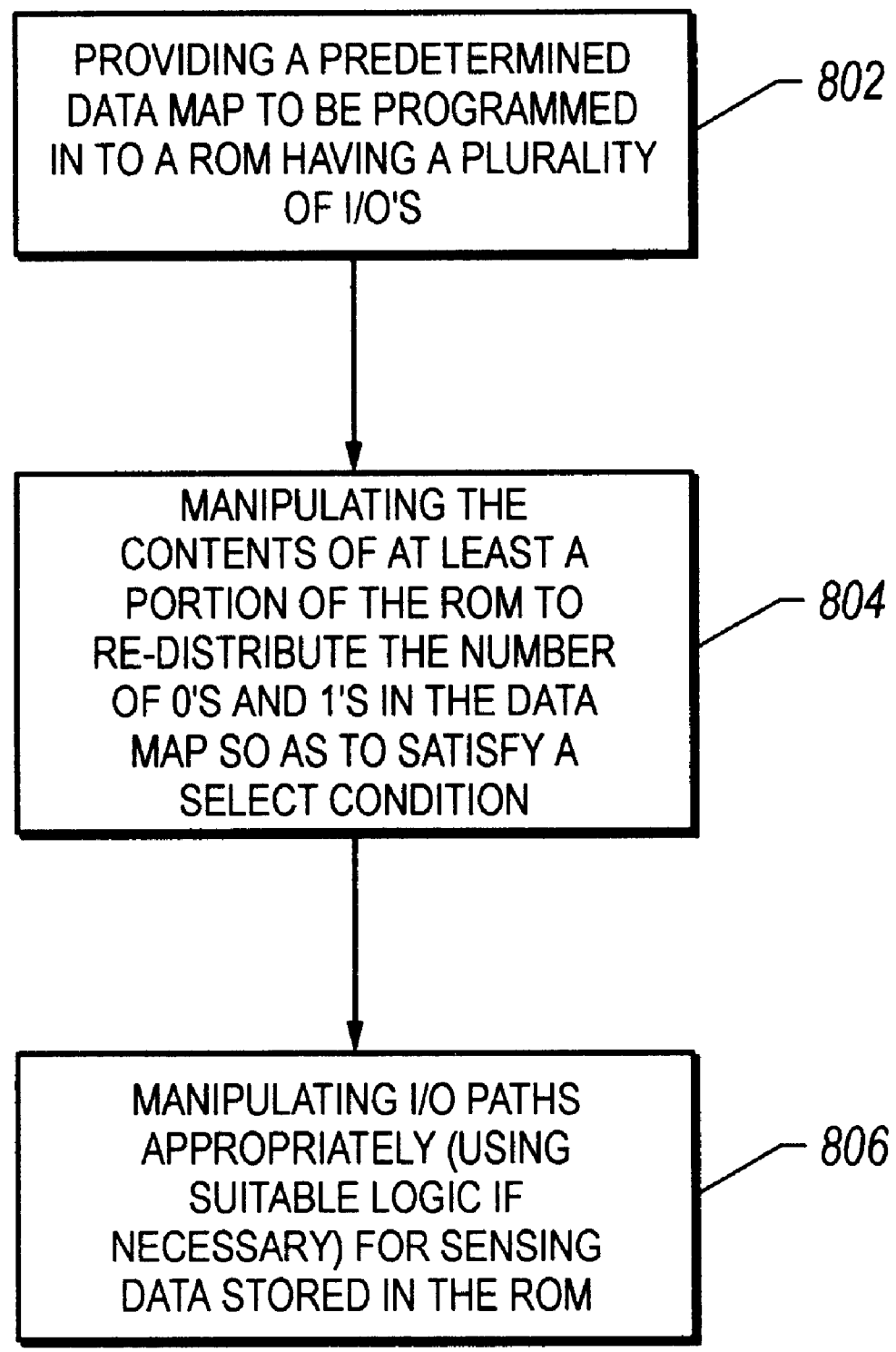
FIG. 8 is a flow chart of the steps involved in a generalized methodology for increasing performance in the ROM in accordance with the teachings of the present invention, wherein the contents of a select ROM portion are manipulated in order to achieve a predetermined binary data distribution condition.

FIG. 8 is a flow chart of the steps involved in a generalized methodology for increasing performance in a compilable ROM in accordance with the teachings of the present invention, wherein the contents of a select ROM portion are manipulated in order to achieve a predetermined binary data distribution condition. Upon providing a predetermined data map to be programmed into the ROM having plurality of I/O blocks (step 802), the contents of at least a portion of the ROM array are manipulated to re-distribute the number of 0's and 1's in the original data map so that a select criterion is satisfied (e.g., no more than 50% 0's in the selected ROM portion) (step 804). Thereafter, the ROM is programmed with the manipulated contents at least for the selected portion. The remainder portions are programmed with the original data as provided. In conjunction with the programming, data output circuitry associated with one or more I/Os is also manipulated (preferably in the same step as the ROM programming step) in order to facilitate correct outputting of the original data (step 806).

Figure 9A:
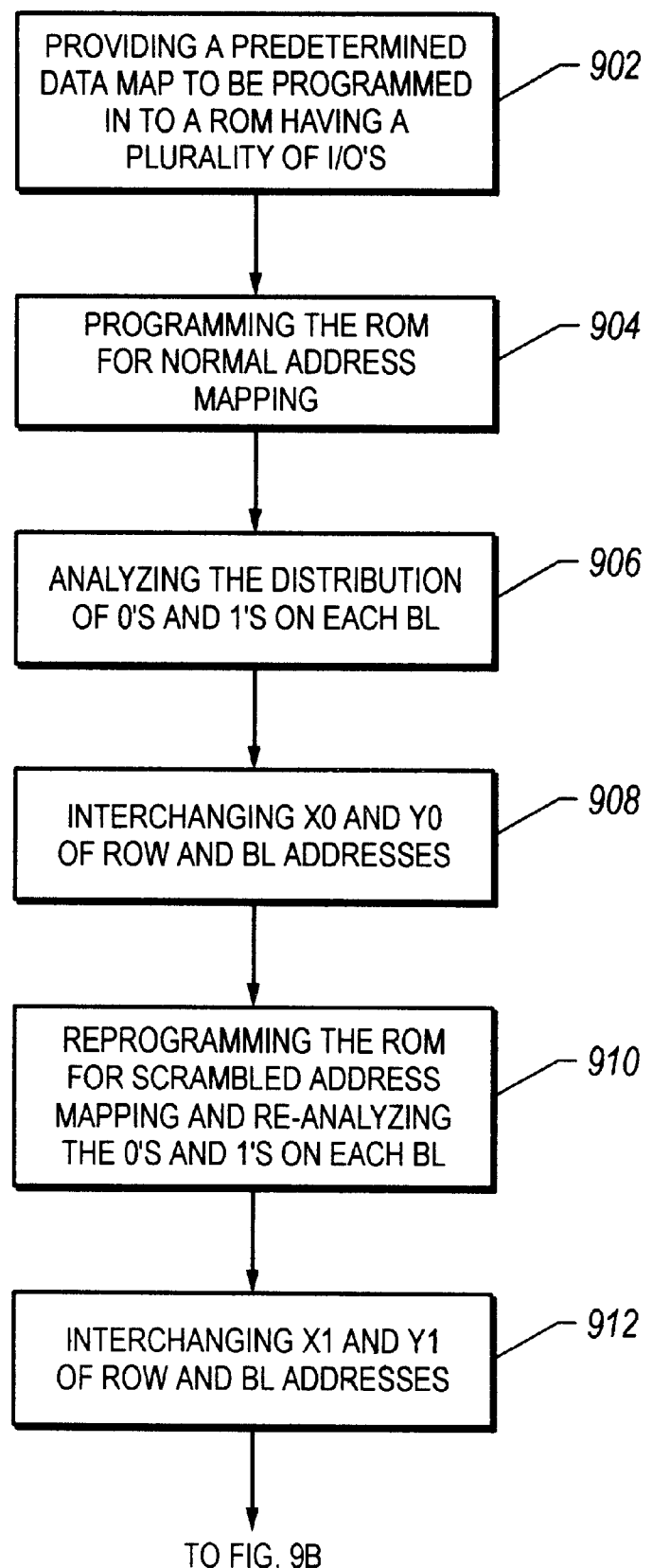
FIGS. 9A and 9B depict a flow chart of the steps illustrating yet another technique for increasing performance in the ROM in accordance with teachings of the present invention, wherein row and column addresses of the ROM are scrambled to re-distribute the binary data.
Figure 9B:
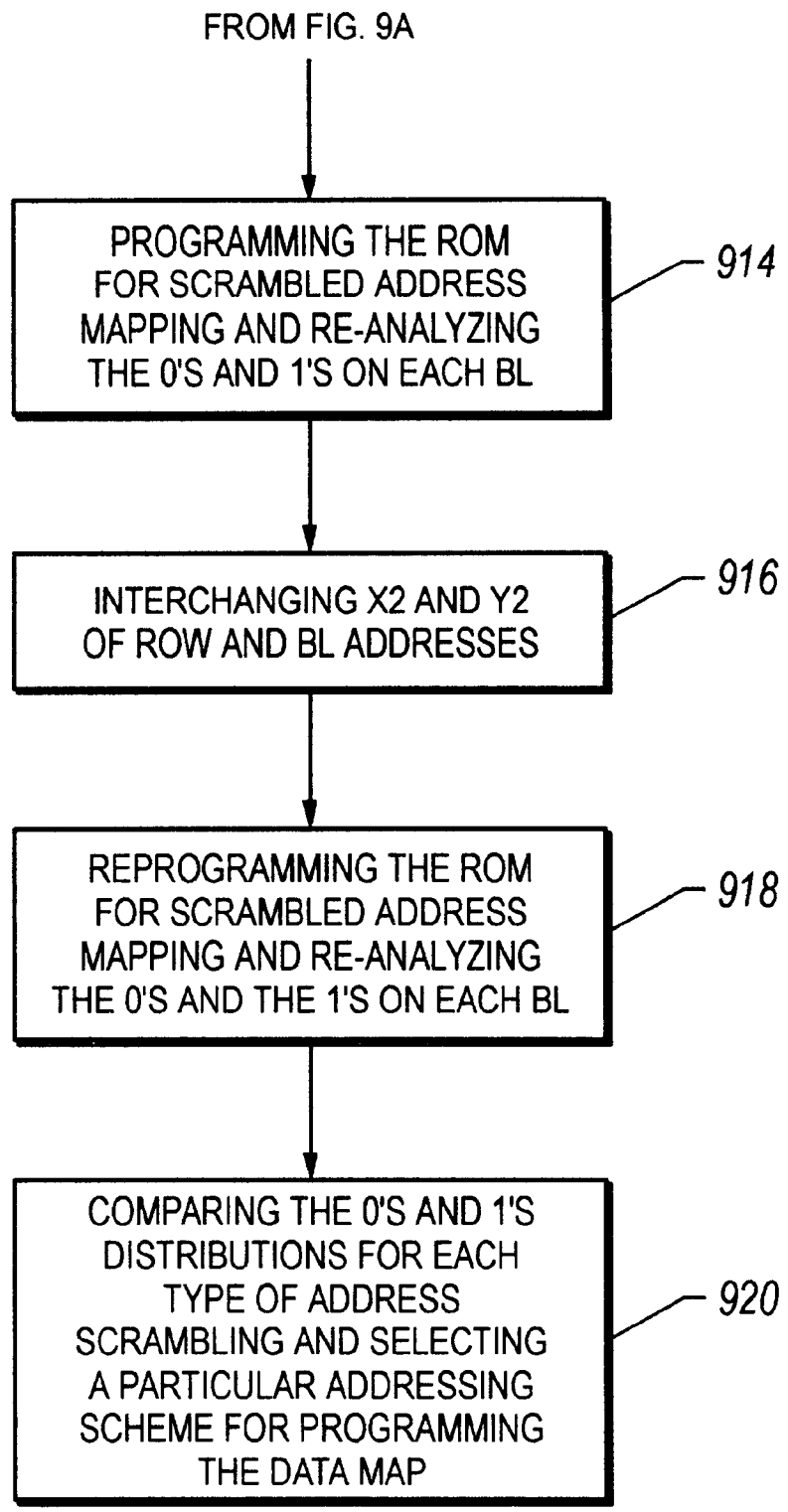

Referring now to FIGS. 9A and 9B, depicted therein is a flow chart of the steps illustrating yet another technique for increasing performance in a ROM in accordance with the teachings of the present invention, wherein the original data map contents are manipulated by scrambling row and column addresses used for programming of the ROM in order to achieve a more desirable distribution of 1's and 0's. Upon providing a predetermined data map to be programmed into the ROM (such as the ROM code provided by a customer) (step 902), the ROM is programmed in software for normal address mapping, e.g., three bits (X0–X2) for row addressing and three bits (Y0–Y2) for column address (step 904). Using the normal address scheme, the ROM code is "programmed" in software (i.e.,.without the actual mask-based programming step used in fabrication) and the resultant distribution of 0's and 1's is analyzed for every BL (step 906). Thereafter, a select portion of the row and column addresses is interchanged therebetween, for example, X0 and Y0 portions are interchanged, and the ROM is re-programmed in software with the original code once again. The distribution of 1's and 0's is analyzed per BL, per I/O, or in any combination thereof. These procedures are provided in steps 908 and 910.

The process of interchanging a select portion between the row and column addresses, re-programming the ROM in software with scrambled addresses, and analyzing the resultant distributions of 1's and 0's may be effectuated for various permutations and combinations possible between the row and column addresses. For example, X1 and Y1 are interchanged as illustrated in step 912. Thus, the ROM is re-programmed with X2Y1X0 for row addressing and Y2X1Y0 for column addressing, and the resultant distribution is analyzed for BL loading of 0's (step 914). Steps 916 and 918 illustrate the process of interchanging X2 and Y2 address bits and re-programming the ROM in software using the scrambled addressing scheme thus obtained. Upon completing the various combinations of address scrambling schemes (or at least a predetermined subset thereof), the distributions of 0's and 1's are compared to determine which address scrambling scheme yields most optimal distribution. Subsequently, the ROM is programmed with that address scheme for storing the data (step 920).

It should be apparent that it is possible to re-distribute the 1's and 0's in the ROM array by interchanging X0 with Y1 or Y2, X1 with Y0 or Y2, etc. Re-distribution may also be possible by interchanging two address bits at a time rather than a single address bit between row addresses and column addresses. Further, since the data is programmed into the ROM (during mask-based programmed) with a select address scheme (which may have been scrambled), there will be no need to descramble the addressing for subsequent data access operations. In addition, it should be appreciated that the address re-mapping scheme set forth hereinabove can give rise to a more equalized distribution of the binary 1's and 0's without any area overhead (e.g., for additional logic circuitry, via placement in output paths, etc.)

Figure 10A:
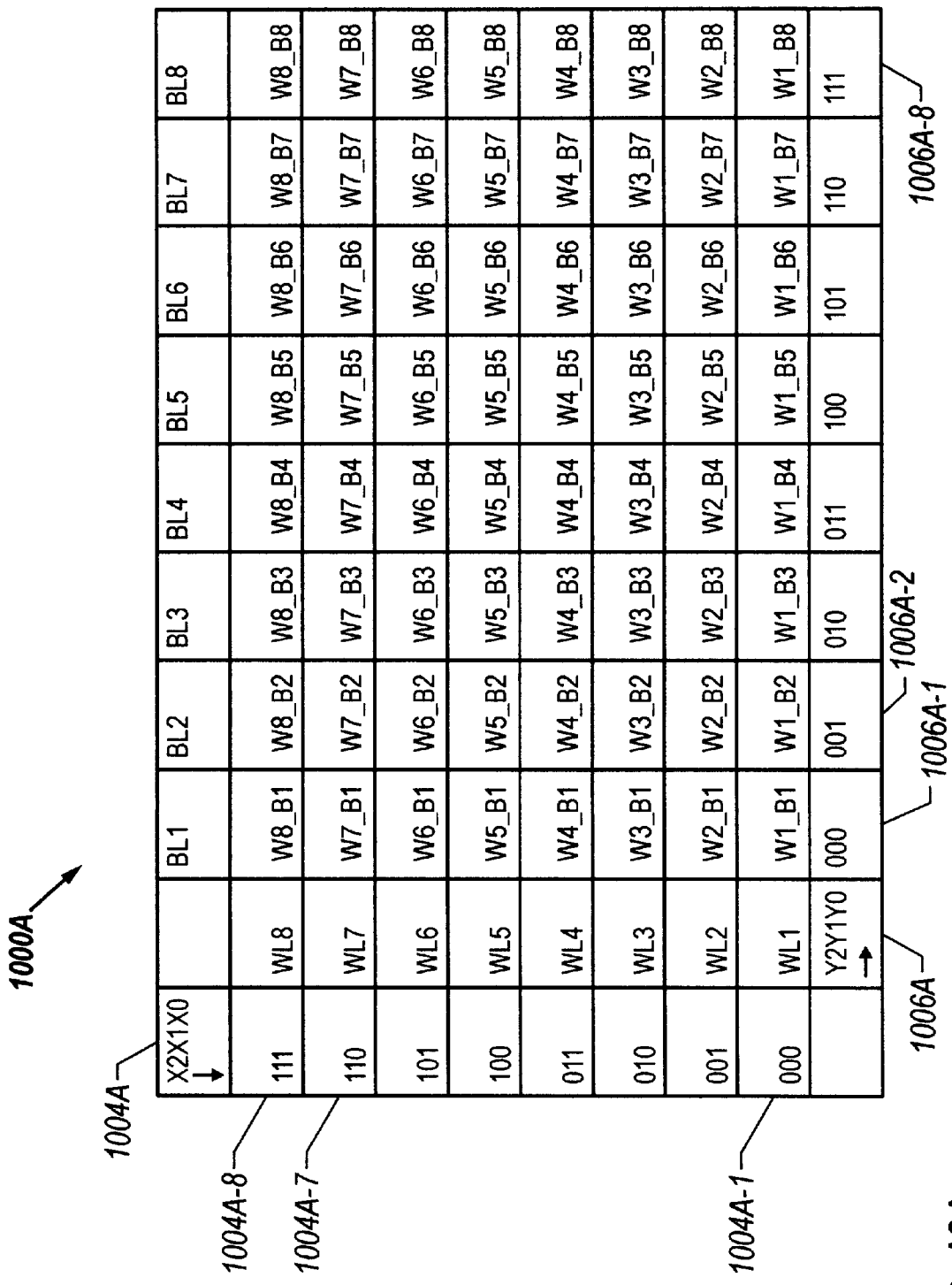

FIGS. 10A and 10B depict exemplary data maps (reference numerals 1000A and 1000B, respectively) of a single I/O block of a ROM for illustrating the address scrambling technique in order to increase ROM's performance in accordance with the teachings of the present invention. Similar to the examples depicted in FIGS. 3A and 3B and FIGS. 6A and 6B, the exemplary I/O block is provided as a matrix of eight rows (requiring a 3-bit address space [X2X1X0] 1004A and eight BL columns (addressable with a 3-bit address space [Y2Y1Y0] 1006A). The data map portion 1000A shown in FIG. 10A is comprised of data in non-scrambled form, wherein normal row and column addresses are used. Reference numerals 1004A-1 through 1004A-8 refer to the eight unscrambled row addresses. Similarly, reference numerals 1006A-1 through 1006A-8 refer to eight column addresses in unscrambled form.

FIG. 10B depicts the data map portion 1000B after interchanging X0 and Y0 address bits. That is, the row selection will now be based on X2, X1 and Y0, and the column selection will be based on Y2, Y1 and X0. Reference numeral 1004B refers to the scrambled row address space [X2X1Y0] and reference numerals 1004B-1 through 1004B-8 refer to the resultant scrambled row addresses. In similar fashion, reference numeral 1006B refers to the scrambled column address space [Y2Y1X0] and reference numerals 1006B-1 through 1006B-8 refer to the resultant scrambled column addresses.

The reprogramming of the ROM contents using the scrambled addresses is done as follows. As an example, consider the memory location addressable by X=[111] and Y=[000] in the normal addressing scheme. By swapping X0 and Y0, the scrambled addresses will be X=[110] and Y=[001]. Thus, in the scrambled data map, the location addressable by X=[111] and Y=[000] is programmed with data located at X=[110] and Y=[001] in the original data map. As illustrated in FIGS. 10A and 10B, the original data map at X=[111] and Y=[000] is [W8_B1] and at X=[110] and Y=[001] is [W7_B2]. Accordingly, the memory location addressable with X=[111] and Y=[000] is now reprogrammed with [W7_B2] in the scrambled data map.

As a further example, consider the memory location addressable by X=[011] and Y=[010] in the normal addressing scheme. By swapping X0 and Y0, the scrambled addresses will be X=[010] and Y=[011]. Thus, in the scrambled data map, the location addressable by X=[011]

and Y=[010] is programmed with data located at X=[010] and Y=[011] in the original data map. The original data at X=[011] and Y=[010] is [W4_B3] and at X=[010] and Y=[011] is [W3_B4]. Accordingly, the memory location addressable with X=[011] and Y=[010] is now reprogrammed with [W3_B4] in the scrambled data map. In similar fashion, the entire data map is scrambled wherein each memory location is reprogrammed with the data addressable in the original data map with scrambled row and column addresses.

As has been pointed out earlier, such address scrambling may be effectuated for various other combinations of the row and column address spaces. Resultant scrambled data maps may then be compared for obtaining a distribution that optimizes BL loading for speed and power consumption.

Based on the foregoing, it should be appreciated that the present invention provides multiple solutions that advantageously enhance performance characteristics of a ROM from the standpoint of speed and power consumption. Further, the architecture is amenable for use with memory compilers such that these advantageous techniques can be implemented in embedded ROM applications in accordance with customer requirements.

It is believed that the operation and construction of the present invention will be apparent from the foregoing Detailed Description. While the methods and circuitry shown and described have been characterized as being preferred, it should be readily understood that various changes and modifications could be made therein without departing from the scope of the present invention as set forth in the following claims. For example, the teachings of the present invention can also be practiced in ROM applications where "reverse logic" is employed (i.e., connected drains imply binary is). Additionally, mask-based programming may be effectuated by placing vias between two metal conductors (N and N+1 levels) or by placing contacts between metal and diffusion layers. In other exemplary embodiments, programming may be effectuated by a single mask, e.g., metal, diffusion, etc. Accordingly, it should be readily recognized by those skilled in the art that these and other changes, variations, substitutions, modifications, deletions, additions, et cetera, are deemed to be within the ambit of the present invention whose scope is defined solely by the claims set forth hereinbelow.

What is claimed is:

1. A technique for increasing performance in a read-only memory (ROM) having at least one input/output (I/O) block, wherein each memory location is addressable by a row address and a column address, said method comprising the steps of:

providing a predetermined data map to be programmed into said ROM;

analyzing the number of binary 0's and 1's in a select portion of said ROM under normal addressing;

interchanging a portion of said row address with a portion of said column address to generate scrambled addresses;

re-distributing said binary 0's and 1's of said data map using said scrambled addresses and re-analyzing the number of binary 0's and 1's under scrambled addressing; and selecting one of said normal addressing and said scrambled addressing for programming said ROM depending on which one results in a better distribution of said binary 0's and 1's.

2. The technique for increasing performance in a ROM having at least one input/output (I/O) block, as set forth in claim 1, further comprising the steps of:

continuing to scramble said row and column addresses by interchanging different portions of said row and columns addresses; and selecting a particular addressing scheme for programming said ROM by comparing different distributions of said binary 0's and 1's.

3. The technique for increasing performance in a ROM having at least one input/output (I/O) block, as set forth in claim 1, wherein each of said row and column addresses comprises a plurality of bits, and further wherein said ROM comprises a compilable ROM.

4. A read-only memory (ROM) for storing a data map, comprising:

an array of memory locations organized into at least one input/output (I/O) block having a select number of bitlines, said memory locations being addressable by a row address space and a column address space; and said memory locations having data programmed therein based on a scrambled address scheme, wherein a portion of said row address space is interchanged with a portion of said column address space.

5. The ROM for storing a data map as set forth in claim 4, wherein each of said portions comprises a single address bit.

6. The ROM for storing a data map as set forth in claim 4, wherein each of said portions comprises at least two address bits.

7. A computer-implemented process for optimizing performance in a read-only memory (ROM) device wherein each memory location is addressable by a row address and a column address, said ROM device operating to contain a data map, comprising the steps of:

analyzing said data map's distribution of binary 0's and binary 1's in a select portion of said ROM device to determine if said distribution is imbalanced in a normal addressing scheme; and if said distribution is determined to be imbalanced, scrambling said row address and said column address for memory locations in said select portion to generate scrambled addresses, wherein when said ROM device is programmed in a software environment with said scrambled addresses, said distribution of binary 0's and binary 1's becomes more balanced.

8. The computer-implemented process for optimizing performance in a ROM device as set forth in claim 7, wherein said row address and said column address of said memory locations are scrambled by interchanging a portion of said row address with a portion of said column address.

9. The computer-implemented process for optimizing performance in a ROM device as set forth in claim 8, wherein each of said portions of said row address and said column address comprises at least a single address bit.

10. The computer-implemented process for optimizing performance in a ROM device as set forth in claim 7, wherein said select portion comprises an I/O block and said distribution of binary 0's and binary 1's in said I/O block is determined to be balanced when each bitline in said I/O block has a substantially equal number of binary 0's and binary 1's.

11. The computer-implemented process for optimizing performance in a ROM device as set forth in claim 7, wherein said step of analyzing said data map's distribution of binary 0's and binary 1's in a select portion and said step of scrambling said row and column addresses are iteratively repeated until a predetermined distribution of binary 0's and binary 1's is achieved.

12. A computer program product having a set of computer-executable instructions for optimizing performance in a read-only memory (ROM) device wherein each memory location is addressable by a row address and a column address, said ROM device operating to contain a data map, comprising:

program code for analyzing said data map's distribution of binary 0's and binary 1's in a select portion of said ROM device to determine if said distribution is imbalanced in a normal addressing scheme; and program code for scrambling said row address and said column address for memory locations in said select portion to generate scrambled addresses if said distribution is determined to be imbalanced, wherein when said ROM device is programmed in a software environment with said scrambled addresses, said distribution of binary 0's and binary 1's becomes more balanced.

13. The computer program product having a set of computer-executable instructions for optimizing performance in a ROM device as set forth in claim 12, wherein said program code for scrambling is operable such that said row address and said column address of said memory locations are scrambled by interchanging a portion of said row address with a portion of said column address.

14. The computer program product having a set of computer-executable instructions for optimizing performance in a ROM device as set forth in claim 13, wherein each of said portions of said row address and said column address comprises at least a single address bit.

15. The computer program product having a set of computer-executable instructions for optimizing performance in a ROM device as set forth in claim 12, wherein said select portion comprises an I/O block and said distribution of binary 0's and binary 1's in said I/O block is determined to be balanced when each bitline in said I/O block has a substantially equal number of binary 0's and binary 1's.

16. The computer program product having a set of computer-executable instructions for optimizing performance in a ROM device as set forth in claim 12, further including program code for iteratively repeating said step of analyzing said data map's distribution of binary 0's and binary 1's in a select portion and said step of scrambling said row and column addresses until a predetermined distribution of binary 0's and binary 1's is achieved.

17. A system for optimizing performance in a read-only memory (ROM) device wherein each memory location is addressable by a row address and a column address, said ROM device operating to contain a data map, comprising:

means for analyzing said data map's distribution of binary 0's and binary 1's in a select portion of said ROM device to determine if said distribution is imbalanced in a normal addressing scheme; and means for scrambling said row address and said column address for memory locations in said select portion to generate scrambled addresses if said distribution is determined to be imbalanced, wherein when said ROM device is programmed in a software environment with said scrambled addresses, said distribution of binary 0's and binary 1's becomes more balanced.

18. The system for optimizing performance in a ROM device as set forth in claim 17, wherein said means for scrambling is operable such that said row address and said column address of said memory locations are scrambled by interchanging a portion of said row address with a portion of said column address.

19. The system for optimizing performance in a ROM device as set forth in claim 18, wherein each of said portions of said row address and said column address comprises at least a single address bit.

20. The system for optimizing performance in a ROM device as set forth in claim 17, wherein said select portion comprises an I/O block and said distribution of binary 0's and binary 1's in said I/O block is determined to be balanced when each bitline in said I/O block has a substantially equal number of binary 0's and binary 1's.

21. The system for optimizing performance in a ROM device as set forth in claim 17, further including means for iteratively repeating said function of analyzing said data map's distribution of binary 0's and binary 1's in a select portion and said function of scrambling said row and column addresses until a predetermined distribution of binary 0's and binary 1's is achieved.

* * * * *